(12) United States Patent
Teng et al.

(10) Patent No.: US 9,542,598 B2
(45) Date of Patent: Jan. 10, 2017

(54) PACKAGE STRUCTURE AND FABRICATION METHOD THEREOF

(71) Applicant: Siliconware Precision Industries Co., Ltd., Taichung (TW)

(72) Inventors: Wen-Yu Teng, Taichung (TW); Liang-Yi Hung, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/631,892

(22) Filed: Feb. 26, 2015

(65) Prior Publication Data
US 2016/0172264 A1 Jun. 16, 2016

(30) Foreign Application Priority Data
Dec. 10, 2014 (TW) .............................. 103142973 A

(51) Int. Cl.
*G06K 9/00* (2006.01)
*H01L 23/00* (2006.01)
(Continued)

(52) U.S. Cl.
CPC ........... *G06K 9/0053* (2013.01); *G06K 9/0002* (2013.01); *G06K 9/0004* (2013.01); *H01L 21/78* (2013.01); *H01L 23/295* (2013.01); *H01L 24/97* (2013.01); *H01L 21/561* (2013.01); *H01L 21/566* (2013.01); *H01L 24/16* (2013.01); *H01L 24/32* (2013.01); *H01L 24/48* (2013.01); *H01L 2224/0401* (2013.01); *H01L 2224/04042* (2013.01); *H01L 2224/16227* (2013.01); *H01L 2224/16245* (2013.01); *H01L 2224/32225* (2013.01); *H01L 2224/32245* (2013.01); *H01L 2224/48091* (2013.01); *H01L 2224/48227* (2013.01); *H01L 2224/48247* (2013.01);
(Continued)

(58) Field of Classification Search
None
See application file for complete search history.

(56) References Cited

U.S. PATENT DOCUMENTS 6,495,270 B1 * 12/2002 Katayose ............. C07D 231/12
257/E23.119
6,858,933 B2 * 2/2005 Abela ................... H01L 21/565
257/730

(Continued)

OTHER PUBLICATIONS

Exposed Die Molding Technology, SPIL, downloaded from URL<http://www.spil.com.tw/technology/?u=6> on Jan. 14, 2016.*
(Continued)

*Primary Examiner* — Joseph Schoenholtz
(74) *Attorney, Agent, or Firm* — Mintz Levin Cohn Ferris Glovsky and Popeo, P.C.; Peter F. Corless; Steven M. Jensen

(57) ABSTRACT

A method for fabricating a package structure is provided, including the steps of: disposing and electrically connecting a sensing chip to a substrate; forming an encapsulant on the substrate to encapsulate the sensing chip; and forming a bright layer on the encapsulant to increase the gloss of the package structure. The encapsulant includes an additive to increase the Mohs hardness of the encapsulant. Further, the encapsulant with different additives presents different colors. Therefore, the invention obtains a high-gloss, high-hardness and colorful sensor package structure.

21 Claims, 3 Drawing Sheets

(51) Int. Cl.
  *H01L 23/29*   (2006.01)
  *H01L 21/78*   (2006.01)
  *H01L 21/56*   (2006.01)

(52) U.S. Cl.
  CPC  *H01L 2224/73265* (2013.01); *H01L 2224/97* (2013.01); *H01L 2924/15311* (2013.01)

(56) References Cited

U.S. PATENT DOCUMENTS

| | | | | |
|---|---|---|---|---|
| 9,152,838 | B2* | 10/2015 | Wickboldt | H05K 1/189 |
| 2002/0177646 | A1* | 11/2002 | Field | C09D 5/084 |
| | | | | 524/430 |
| 2011/0309482 | A1* | 12/2011 | Salatino | G06K 9/00053 |
| | | | | 257/659 |
| 2014/0103943 | A1* | 4/2014 | Dunlap | G01N 27/221 |
| | | | | 324/663 |
| 2014/0140588 | A1* | 5/2014 | Chou | G06K 9/0002 |
| | | | | 382/124 |
| 2014/0367841 | A1* | 12/2014 | Huang | H01L 24/97 |
| | | | | 257/692 |
| 2015/0287659 | A1* | 10/2015 | Liu | H01L 23/3114 |
| | | | | 257/737 |

OTHER PUBLICATIONS

Brau, T., et. al., "Compression Molding for Large Area Fan-Out Wafer/Panel Level Packaging", SEMI Packaging Tech Seminar, Jun. 18, 2015, Vil do Conde Portugal.*

Definition of encapsulated downloaded from URLhttp://www.merriam-webster.com/dictionary/encapsulated on May 13, 2016.*

* cited by examiner

PACKAGE STRUCTURE AND FABRICATION METHOD THEREOF

CROSS-REFERENCES TO RELATED APPLICATIONS

This application claims under 35 U.S.C. §119(a) the benefit of Taiwanese Application No. 103142973, filed Dec. 10, 2014, the entire contents of which are incorporated herein by reference.

BACKGROUND OF THE INVENTION

1. Field of the Invention

The present invention relates to package structures, and more particularly, to a package structure of a fingerprint sensor.

2. Description of Related Art

Nowadays, as people are paying more and more attention on privacy protection, many high-end electronic products are equipped with identification systems to improve data security. Therefore, research and development of identification systems are becoming increasingly important in electronic industries.

Generally, a high-end electronic product can be equipped with a biological identification device such as a fingerprint identification device or a face identification device. Currently, fingerprint identification devices are the most widely used devices since such devices facilitate to meet the miniaturization requirement of electronic products. Fingerprint identification devices are divided into optical fingerprint identification devices that can optically scan fingerprint patterns and silicon fingerprint identification devices that can detect faint electrical charges in fingerprint patterns.

FIG. 1 is a schematic cross-sectional view of a conventional package structure 1 of a fingerprint sensor. Referring to FIG. 1, the package structure 1 has: a substrate 10 having a plurality of first conductive pads 101; a sensing chip 11 having a finger swipe sensing area 110 and a plurality of second conductive pads 111; and an encapsulant 12 encapsulating the sensing chip 11 and exposing the sensing area 110 of the sensing chip 11.

In particular, the sensing chip 11 is disposed on the substrate 10 and the second conductive pads 111 of the sensing chip 11 are electrically connected to the first conductive pads 101 of the substrate 10 through a plurality of bonding wires 13. The encapsulant 12 is formed on the substrate 10 and seals the bonding wires 13.

However, the surface of the finger swipe sensing area 110 of the sensing chip 11 is easily damaged due to direct contact of fingers with the finger swipe sensing area 110, thus shortening the lifetime of the fingerprint sensor.

Therefore, there is a need to provide a package structure and a fabrication method thereof so as to overcome the above-described drawbacks.

SUMMARY OF THE INVENTION

In view of the above-described drawbacks, the present invention provides a method for fabricating a package structure, which comprises the steps of: disposing and electrically connecting at least an electronic element to a substrate; forming an encapsulant on the substrate to encapsulate the electronic element; and forming a bright layer on the encapsulant.

The electronic element can be a sensing chip, which has a sensing surface with a sensing area completely covered by the encapsulant and a non-sensing surface opposite to the sensing surface and bonded to the substrate.

The substrate having the electronic element disposed thereon can be received in a mold having an upper mold and a lower mold, wherein a release film is formed on an inner surface of the upper mold. As such, a molding process can be performed to form the encapsulant encapsulating the electronic element. The release film facilitates to reduce the surface roughness of the encapsulant.

The encapsulant can comprise a polymer and an additive. The additive can be selected from ceramic fillers so as to increase the Mohs hardness of the encapsulant. Further, the encapsulant with different additives can present different colors.

The present invention further provides a package structure, which comprises: a substrate; at least an electronic element disposed on and electrically connected to the substrate; an encapsulant formed on the substrate to encapsulate the electronic element; and a bright layer formed on the encapsulant.

Therefore, by receiving the substrate having the sensing chips disposed thereon in a mold having a release film, the present invention forms an encapsulant encapsulating the sensing chips and having a low surface roughness. The encapsulant includes a polymer and an additive. The additive is selected from ceramic fillers so as to increase the Mohs hardness of the encapsulant. As such, the present invention avoids direct contact of fingers with the sensing area and prolongs the lifetime of the package structure. Further, the encapsulant with different additives can present different colors. Furthermore, the bright layer increases the gloss of the package structure. Therefore, the present invention obtains a high-gloss, high-hardness and colorful sensor package structure.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2D are schematic cross-sectional views showing a method for fabricating a package structure according to a first embodiment of the present invention.

Figure 1:
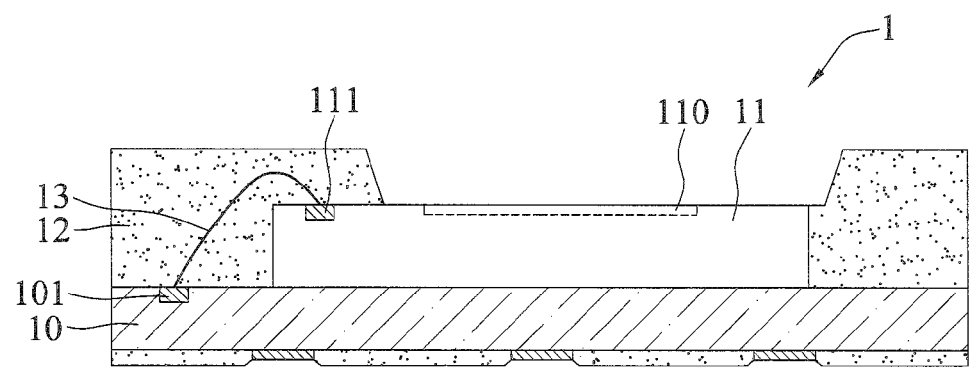
FIG. 1 is a schematic cross-sectional view of a conventional package structure.
Figure 2A:
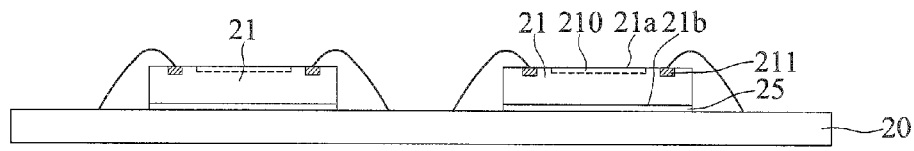
FIGS. 2A and 2D are schematic cross-sectional views showing a method for fabricating a package structure according to a first embodiment of the present invention.

Referring to FIG. 2A, a plurality of electronic elements 21 are disposed on and electrically connected to a substrate 20. Each of the electronic elements 21 has a sensing surface 21a with a sensing area 210 and a non-sensing surface 21b opposite to the sensing surface 21a and bonded to the substrate 20.

The substrate 20 is a carrier such as a lead frame or a circuit board.

The electronic elements 21 are sensing chips that are used to detect changes in electrical charges, temperature or pressure of a living organism. Preferably, the electronic elements 21 are fingerprint identification chips that perform a biological identification based on a capacitance difference received from the sensing area.

The non-sensing surface 21b of each of the electronic elements 21 is bonded to the substrate 20 through an adhesive layer 25 to thereby fix the electronic element 21 to the substrate 20. The sensing surface 21a of the electronic element 21 has a plurality of conductive pads 211 that are electrically connected to the substrate 20 through bonding wires.

Figure 2B:
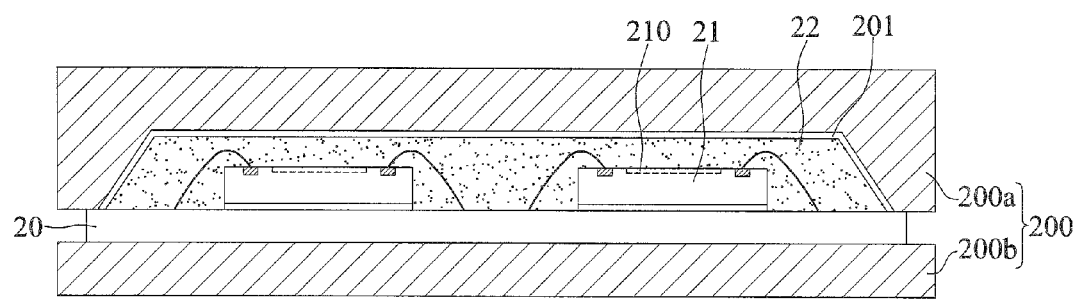

Referring to FIG. 2B, the substrate 20 having the electronic elements 21 disposed thereon is received in a mold 200 having an upper mold 200a and a lower mold 200b, and a molding process is performed to form an encapsulant 22 on the substrate 20. As such, the electronic elements 21 are embedded in the encapsulant 22 and the sensing areas 210 of the electronic elements 21 are completely covered by the encapsulant 22.

A release film 201 is formed on an inner surface of the upper mold 200a to reduce the surface roughness (Ra) of the encapsulant 22. As such, the surface roughness of the encapsulant 22 is less than 0.1 um.

Further, the encapsulant 22 includes a polymer and an additive. The additive is selected from ceramic fillers so as to increase the Mohs hardness of the encapsulant 22. As such, the Mohs hardness of the encapsulant 22 is greater than 6, i.e., close to a pencil. In addition, the encapsulant 22 with different additives presents different colors. Therefore, a colorful package structure can be formed.

Figure 2C:
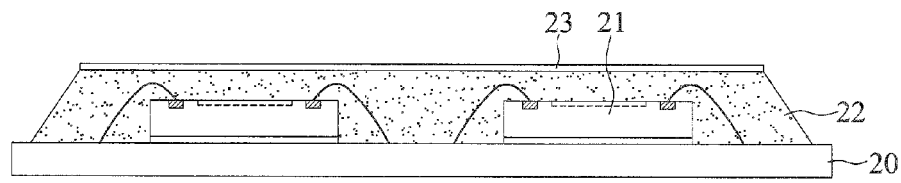

Referring to FIG. 2C, the mold 200 is removed and a bright layer 23 is formed by spray or spin coating on the encapsulant 22. The bright layer 23 has a gloss of 50 to 60 GU (Gloss Unit).

Figure 2D:
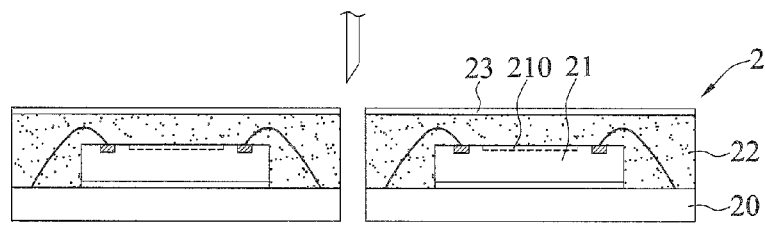

Referring to FIG. 2D, a singulation process is performed to form a plurality of package structures 2.

The package structure 2 of the present invention has: a substrate 20; an electronic element 21 disposed on and electrically connected to the substrate 20; an encapsulant 22 formed on the substrate 20 to encapsulate the electronic element 21; and a bright layer 23 formed on the encapsulant 22. The electronic element 21 is a sensing chip having a sensing area 210 that is covered by the encapsulant 22. The encapsulant 22 includes a polymer and an additive. The additive is selected from ceramic fillers to increase the Mohs hardness of the encapsulant 22. As such, the Mohs hardness of the encapsulant 22 is greater than 6. Further, the encapsulant 22 with different additives presents different colors. During application of the package structure 2 in a fingerprint sensor, when fingers touch the surface of the encapsulant 22, the sensing area 210 scans the capacitance difference so as for the sensing chip to make identification.

Figure 3:
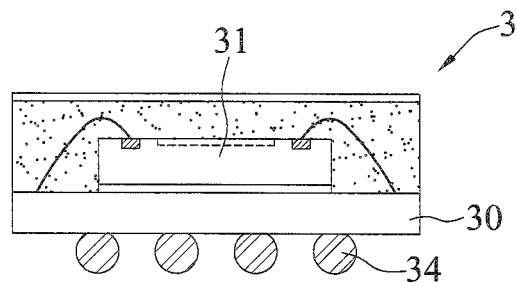
FIG. 3 is a schematic cross-sectional view of a package structure according to a second embodiment of the present invention.

FIG. 3 is a schematic cross-sectional view of a package structure according to a second embodiment of the present invention. The package structure 3 of the present embodiment differs from the first embodiment in that the substrate 30 is a circuit board and a plurality of solder balls 34 are formed on a surface of the substrate 30 opposite to the surface of the substrate 30 having the electronic element 31 disposed thereon.

Figure 4:
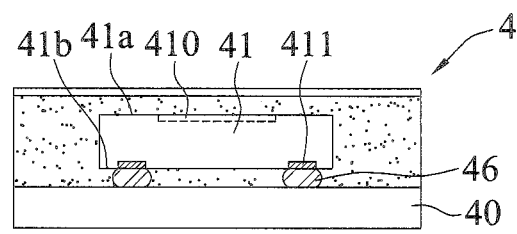
FIG. 4 is a schematic cross-sectional view of a package structure according to a third embodiment of the present invention.

FIG. 4 is a schematic cross-sectional view of a package structure according to a third embodiment of the present invention. The package structure 4 of the present embodiment differs from the above-described embodiments in that the electronic element 41 is electrically connected to the substrate 40 in a flip-chip manner.

The electronic element 41 has a sensing surface 41a with a sensing area 410 and a non-sensing surface 41b opposite to the sensing surface 41a. The non-sensing surface 41b of the electronic element 41 has a plurality of conductive pads 411 that are bonded to the substrate 40 through conductive bumps 46.

Therefore, by receiving the substrate having the sensing chips disposed thereon in a mold having a release film, the present invention forms an encapsulant encapsulating the sensing chips and having a low surface roughness. The encapsulant includes a polymer and an additive. The additive is selected from ceramic fillers so as to increase the Mohs hardness of the encapsulant. As such, the present invention avoids direct contact of fingers with the sensing area and prolongs the lifetime of the package structure. Further, the encapsulant with different additives can present different colors. Furthermore, the bright layer increases the gloss of the package structure. Therefore, the present invention obtains a high-gloss, high-hardness and colorful sensor package structure.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating a package structure, comprising the steps of:
   providing at least an electronic element having a sensing surface and a non-sensing surface opposite to the sensing surface;
   disposing the electronic element on a substrate and bonding the non-sensing surface of the electronic element to the substrate through an adhesive layer, and electrically connecting the electronic element and the substrate;
   forming an encapsulant on the substrate to encapsulate side surfaces and the sensing surface of the electronic element, wherein the encapsulant has a surface roughness less than 0.1 um; and
   forming a bright layer on the encapsulant.

2. The method of claim 1, wherein the electronic element is a fingerprint sensing chip.

3. The method of claim 1, wherein the sensing surface has a sensing area completely covered by the encapsulant.

4. The method of claim 1, wherein the substrate is a lead frame or a circuit board.

5. The method of claim 1, wherein the electronic element is electrically connected to the substrate through wire bonding or in a flip-chip manner.

6. The method of claim 1, wherein forming the encapsulant comprises: receiving the substrate having the electronic element disposed thereon in a mold having an upper mold and a lower mold, wherein a release film is formed on an inner surface of the upper mold; and performing a molding process to form the encapsulant encapsulating the electronic element.

7. The method of claim 1, wherein the encapsulant comprises a polymer and an additive that is selected from ceramic fillers.

8. The method of claim 7, wherein the encapsulant with different additives presents different colors.

9. The method of claim 1, wherein the encapsulant has a Mohs hardness greater than 6.

10. The method of claim 1, wherein the bright layer is formed on the encapsulant by spray or spin coating.

11. The method of claim 1, wherein the bright layer has a gloss of 50 to 60 GU.

12. The method of claim 1, wherein a plurality of electronic elements are disposed on the substrate, and the method further comprises performing a singulation process.

13. The method of claim 1, further comprising forming a plurality of solder balls on a surface of the substrate opposite to the surface having the electronic element thereon.

14. A package structure, comprising:
   a substrate;
   at least an electronic element having a sensing surface and a non-sensing surface opposite to the sensing surface, wherein the electronic element is disposed on and electrically connected to the substrate, and the non-sensing surface of the electronic element is bonded to the substrate through an adhesive layer;
   an encapsulant formed on the substrate to encapsulate side surfaces and the sensing surface of the electronic element, wherein the encapsulant has a surface roughness less than 0.1 um; and
   a bright layer formed on the encapsulant.

15. The structure of claim 14, wherein the electronic element is a fingerprint sensing chip.

16. The structure of claim 14, wherein the sensing surface has a sensing area completely covered by the encapsulant.

17. The structure of claim 14, wherein the substrate is a lead frame or a circuit board.

18. The structure of claim 14, wherein the electronic element is electrically connected to the substrate through wire bonding or in a flip-chip manner.

19. The structure of claim 14, wherein the encapsulant comprises a polymer and an additive.

20. The structure of claim 19, wherein the additive is selected from ceramic fillers and the encapsulant has a Mohs hardness greater than 6.

21. The structure of claim 14, wherein the bright layer has a gloss of 50 to 60 GU.

* * * * *